(12) United States Patent
Coggan et al.

(10) Patent No.: US 7,858,207 B2
(45) Date of Patent: Dec. 28, 2010

(54) HOST MATERIAL FOR ORGANIC ELECTROLUMINESCENCE DEVICES

(75) Inventors: Jennifer A. Coggan, Cambridge (CA); Hany Aziz, Oakville (CA)

(73) Assignee: LG Display Co., Ltd., Seoul (KR)

( * ) Notice: Subject to any disclaimer, the term of this patent is extended or adjusted under 35 U.S.C. 154(b) by 1104 days.

(21) Appl. No.: 11/312,602

(22) Filed: Dec. 21, 2005

(65) Prior Publication Data

US 2007/0141391 A1  Jun. 21, 2007

(51) Int. Cl.
*H01L 51/54* (2006.01)
(52) U.S. Cl. ............... 428/690; 428/917; 313/504; 313/506
(58) Field of Classification Search ............... None
See application file for complete search history.

(56) References Cited

U.S. PATENT DOCUMENTS

| | | | |
|---|---|---|---|
| 4,356,429 | A | 10/1982 | Tang |
| 4,539,507 | A | 9/1985 | VanSlyke et al. |
| 4,720,432 | A | 1/1988 | VanSlyke et al. |
| 4,769,292 | A | 9/1988 | Tang et al. |
| 4,885,211 | A | 12/1989 | Tang et al. |
| 5,150,006 | A | 9/1992 | VanSlyke et al. |
| 5,151,629 | A | 9/1992 | VanSlyke |
| 5,409,783 | A | 4/1995 | Tang et al. |
| 5,429,884 | A | 7/1995 | Namiki et al. |
| 5,516,577 | A | 5/1996 | Matsuura et al. |

(Continued)

FOREIGN PATENT DOCUMENTS

| | | |
|---|---|---|
| JP | 07-150137 | 6/1995 |
| JP | 2005-048004 A | 2/2005 |
| JP | 2005-93159 | * 4/2005 |

OTHER PUBLICATIONS

Machine translation of claims+description for JP 2005-093159 A, published Apr. 2005.*

*Primary Examiner*—Dawn Garrett
(74) *Attorney, Agent, or Firm*—McKenna Long & Aldridge LLP (57) ABSTRACT

A novel class of host materials for organic electroluminescent applications. The materials comprise a general Formula I:

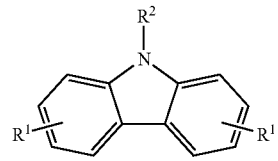

Formula I wherein $R^2$ may be a substituent selected from the group consisting of hydrogen, alkyl, substituted or unsubstituted aryl, heteroaryl, and alicyclic alkyl; wherein at least one of the $R^1$ substituents is different from $R^2$ and chosen from Group A where Group A consists of substituted or unsubstituted aryl, heteroaryl, phenyl, tolyl, naphthyl, anthryl, penylanthryl, dipheylanthryl, biphenylyl, phenylvinyl, and diphenylvinyl; and wherein if only one of the $R^1$ substituents is a substitutent chosen from Group A, then the other $R^1$ substituent is selected from the group consisting of hydrogen, an alkyl group with, for example, from 1 to about 25 carbon atoms, an alicyclic alkyl group with, for example, from about 3 to about 15 carbon atoms, an alkoxy group with from 1 to about 25 carbon atoms, a dialkylamino group with from about 2 to about 25 carbon atoms, methyl, butyl, cyclohexyl, methoxy, ethoxy, butyloxy, dimethylamino, diethylamino, a cyano group and halogens. This novel class of host materials are carbazole derivatives with an unique structure, which are particularly useful for the design of blue emitting organic EL devices.

16 Claims, 3 Drawing Sheets

U.S. PATENT DOCUMENTS

| | | |
|---|---|---|
| 5,846,666 A | 12/1998 | Hu et al. |
| 6,225,467 B1 | 5/2001 | Esteghamatian et al. |
| 6,229,012 B1 | 5/2001 | Hu et al. |
| 6,670,054 B1 * | 12/2003 | Hu et al. .................... 428/690 |
| 7,352,125 B2 * | 4/2008 | Aziz et al. .................. 313/504 |
| 2004/0013903 A1 * | 1/2004 | Lin ............................ 428/690 |
| 2004/0018380 A1 * | 1/2004 | Aziz et al. .................. 428/690 |
| 2004/0018383 A1 * | 1/2004 | Aziz et al. .................. 428/690 |
| 2004/0110031 A1 * | 6/2004 | Fukuda et al. ............. 428/690 |
| 2005/0084711 A1 * | 4/2005 | Sasaki et al. ................ 428/690 |
| 2006/0020136 A1 * | 1/2006 | Hwang et al. .............. 548/440 |
| 2006/0115680 A1 * | 6/2006 | Hwang et al. .............. 428/690 |
| 2007/0138947 A1 * | 6/2007 | Popovic et al. ............. 313/504 |

* cited by examiner

HOST MATERIAL FOR ORGANIC ELECTROLUMINESCENCE DEVICES

BACKGROUND OF THE INVENTION

1. Field of the Invention

This invention is related to organic electroluminescent (EL) devices, and more specifically, EL devices with excellent performance characteristics, and which devices contain novel carbazole compounds. The organic EL devices of the present invention contain charge transport/luminescent materials comprised of a new class of carbazole compounds that may enable the aforementioned characteristics. These devices can be selected for use in flat-panel emissive display technologies, including TV screens, computer screens, and the like.

2. Discussion of the Related Art

It is desirable to have organic EL devices that are capable of providing uniform luminescence, saturated color in blue, green and red, and low driving voltages. A typical organic EL device can be comprised of a layer of an organic luminescent material conductively sandwiched between an anode, typically comprised of a transparent conductor, such as indium tin oxide, and a cathode, typically a low work function metal such as magnesium, calcium, aluminum, or the alloys thereof with other metals.

EL devices function on the principle that under an electric field, positive charges (holes) and negative charges (electrons) are respectively injected from the anode and cathode into the luminescent layer and undergo recombination to form excitonic states which subsequently emit light. Typically, for visual display applications, organic luminescent materials should provide a satisfactory color in the visible spectrum, normally with emission maxima at about 460, 550 and 630 nanometers for blue, green and red.

Several prior art organic EL devices have been constructed from a laminate of an organic luminescent material and electrodes of opposite polarity. These devices typically include a single crystal material, such as single crystal anthracene. However, these devices usually require excitation voltages on the order of 100 volts or greater.

Organic EL devices with a multilayer structure can be formed as a dual layer structure comprising one organic layer adjacent to the anode supporting hole transport, and another organic layer adjacent to the cathode supporting electron transport and acting as the organic luminescent zone of the device. Another alternative device configuration is comprised of three separate layers, a hole transport layer, a luminescent layer, and an electron transport layer, which layers are laminated in sequence and are sandwiched between an anode and a cathode.

Optionally, a fluorescent dopant material can be added to the emission zone or layer whereby the recombination of charges results in the excitation of the fluorescent dopant material.

In U.S. Pat. No. 4,539,507, the disclosure of which is fully incorporated herein by reference, there is disclosed an EL device formed of a conductive glass transparent anode, a hole transporting layer of 1,1-bis(4-p-tolylaminophenyl)cyclohexane, an electron transporting layer of 4,4'-bis(5,7-di-tert-pentyl-2-benzoxyzolyl)stilbene, and an indium cathode. In U.S. Pat. No. 6,229,012, the disclosure of which is also fully incorporated herein by reference, there are illustrated devices with certain carbazoles.

U.S. Pat. No. 4,720,432, the disclosure of which is fully incorporated herein by reference, discloses an organic EL device comprising a dual-layer hole injecting and transporting zone, one layer being comprised of porphyrinic compounds supporting hole injection and the other layer being comprised of aromatic tertiary amine compounds supporting hole transport.

U.S. Pat. No. 4,769,292, the disclosure of which is fully incorporated herein by reference, discloses an EL device employing a luminescent zone comprised of an organic host material capable of sustaining hole-electron recombination and a fluorescent dye material capable of emitting light in response to energy released by hole-electron recombination. One host material disclosed in the '292 patent is an aluminum complex of 8-hydroxyquinoline, and more specifically, tris(8-hydroxyquinolinate)aluminum.

U.S. Pat. No. 5,409,783, the disclosure of which is fully incorporated herein by reference, discloses a red-emitting organic EL device containing a dopant of a tris(8-hydroxyquinolinate)aluminum with a red fluorescent dye. Further, blue-emitting organic EL devices are illustrated in, for example, U.S. Pat. Nos. 5,151,629 and 5,516,577, the disclosures of which are fully incorporated herein by reference.

Organic light emitting devices represent a promising technology for display applications. For efficient light emission in an OLED a guest-host system is often used which helps with charge distribution within the OLED and combats the formation of exiplexes in the emitting material. A good guest-host system is one in which electrons and holes are transported through the guest-host matrix leading to complete charge recombination on the guest. It is desirable to have a bad-gap of the guest that falls within the band-gap of the host.

While progress in organic EL research has elevated the potential of organic EL devices for widespread applications, the performance levels of a number of devices are still below expectations in several instances. For example, forming a good guest-host system for blue emitting organic EL devices is very difficult. This is due to the wide band gap for blue guest materials. In fact, finding an even larger band gap for the host material is extremely difficult. This is important for both fluorescent as well as phosphorescent OLEDs.

SUMMARY OF THE INVENTION

Accordingly, the present invention is directed to a host material for organic electroluminescent devices that substantially obviates one or more of the problems due to limitations and disadvantages of the related art.

One advantage of the present invention is that it can provide a material wherein the guest band-gap that falls within the band-gap of the host.

Additional examples of features and advantages of the invention will be set forth in the description which follows, and in part will be apparent from the description or by practice of the invention.

To achieve these and other advantages and in accordance with an exemplary embodiment of the present invention, as embodied and broadly described, an organic electroluminescent device comprises an anode, a cathode, and a compound of Formula I:

Formula I wherein $R^2$ may be a substituent selected from the group consisting of hydrogen, alkyl, substituted or unsubstituted aryl, heteroaryl, and alicyclic alkyl; wherein at least one of the $R^1$ substituents is different from $R^2$ and chosen from Group A where Group A consists of substituted or unsubstituted aryl, heteroaryl, phenyl, tolyl, naphthyl, anthryl, penylanthryl, dipheylanthryl, biphenylyl, phenylvinyl, and diphenylvinyl; and wherein if only one of the $R^1$ substituents is a substituent chosen from Group A, then the other $R^1$ substituent is selected from the group consisting of hydrogen, an alkyl group with, for example, from 1 to about 25 carbon atoms, an alicyclic alkyl group with, for example, from about 3 to about 15 carbon atoms, an alkoxy group with from 1 to about 25 carbon atoms, a dialkylamino group with from about 2 to about 25 carbon atoms, methyl, butyl, cyclohexyl, methoxy, ethoxy, butyloxy, dimethylamino, diethylamino, cyano group, and halogens.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention and together with the description serve to explain the principles of the invention.

In the drawings.

DETAILED DESCRIPTION OF THE ILLUSTRATED EMBODIMENTS

Reference will now be made in detail to exemplary embodiments of the present invention, examples of which are illustrated in the accompanying drawings.

The new class of host materials for organic EL applications according to the present invention is represented by the general Formula I:

Formula I wherein $R^2$ may be a substituent selected from the group consisting of hydrogen, alkyl, substituted or unsubstituted aryl, heteroaryl, and alicyclic alkyl; wherein at least one of the $R^1$ substituents is different from $R^2$ and chosen from Group A where Group A consists of substituted or unsubstituted aryl, heteroaryl, phenyl, tolyl, naptyl, anthryl, penylanthryl, dipheylanthryl, biphenylyl, phenylvinyl, and diphenylvinyl; and wherein if only one $R^1$ is a substitutent chosen from Group A, then the other is a substitutent selected from the group consisting of hydrogen, an alkyl group with, for example, from 1 to about 25 carbon atoms, an alicyclic alkyl group with, for example, from about 3 to about 15 carbon atoms, an alkoxy group with from 1 to about 25 carbon atoms, a dialkylamino group with from about 2 to about 25 carbon atoms, methyl, butyl, cyclohexyl, methoxy, ethoxy, butyloxy, dimethylamino, diethylamino, cyano group and halogens.

These types of compounds can be prepared using conventional synthetic methods. The $R^1$ group may, for example, be introduced by reacting the carbazole with an appropriate iodo compound using an Ulmann condensation reaction or with an appropriate bromo compound using a Buchwald-Hartwig reaction. Furthermore, the $R^2$ group may be introduced by first brominating the carbazole and then reacting it with an appropriate boronic acid using a Suzuki reaction.

The following is an exemplary synthesis for the preparation of a generalized exemplary embodiment of the novel carbazole compound according to the present invention. Other synthesis is are also possible.

These novel compounds may be used as host materials or by themselves. These compounds may generally be used as light emitting materials. Accordingly, various EL devices that fall within the scope of the present invention may be manufactured using the material of general Formula I. In some exemplary embodiments of the present invention, a material of general Formula I may be provided between an anode and a cathode. Alternatively, the material of general Formula I may be used in conjunction with one or more electron transporting materials, hole transporting materials, buffer materials, hole injection and electron injection materials and any other material typically used in organic EL devices.

The materials of general Formula I, according to the present invention, are particularly useful as a host material because the they have a relatively wide band gap as compared to other light emitting materials. The band gap of the materials according to general Formula I of the present invention is wide enough to allow the band gap of the guest materials to fall within it. It is particularly useful in blue emitting devices because, unlike other light emitting materials, the materials of general Formula I have a band gap wide enough to allow for the band gap of blue emitting guest materials, which is generally very wide, to fall within it thereby allowing for the complete charge recombination on the guest material.

In one exemplary embodiment of the present invention there are provided organic EL devices comprised of a supporting substrate, an anode, an optional buffer layer, a hole transporting layer, a light emitting layer comprising a material of general Formula I, an electron transporting layer, and in contact therewith a low work function metal, such as a cathode.

In the exemplary embodiments it is desirable that the organic EL devices comprise a supporting substrate. Illustrative examples of the supporting substrate include polymeric components, glass and the like, and polyesters like MYLAR™, polycarbonates, polyacrylates, polymethacrylates, polysulfones, quartz, and the like. Other substrates can also be selected provided the material chosen can effectively support the other layers, and that the substrate does not substantially interfere with the device functional performance. The thickness of the substrate can be, for example, from about 25 to about 5,000 microns or more, and for example, from about 50 to about 3,000 depending, for example on the structural demands of the device.

Examples of the anode which is contiguous to the substrate, include positive charge injecting electrodes, such as indium tin oxide, tin oxide, gold, platinum, or other materials such as electrically conductive carbon, with a work function equal to, or greater than about 4 electron volts, and more specifically, from about 4 to about 6 electron volts. The thickness of the anode can range from about 1 to about 5,000 nanometers with the preferred range being dictated by the optical constants of the anode material. One exemplary range of thickness for the electrode, such as the anode, is from about 30 to about 100 nanometers.

The buffer layer illustrated herein is optional. The functions of this layer are primarily to facilitate efficient injection of holes from the anode, and to improve the adhesion between the anode and the organic hole transporting layer, thus further improving the device operation stability in embodiments. Examples of buffer layer materials include conductive materials, such as polyanilines and their acid-doped forms, polythiophenes and their acid-doped forms, polypyrrole, poly (phenylene vinylene), amorphous graphite or carbon and the like. Preferred materials used in the buffer layer are hole transport molecules. Specific examples of such hole transport materials are porphyrin derivatives, such as those disclosed in U.S. Pat. No. 4,356,429, the disclosure of which is fully incorporated herein by reference, including 1,10,15,20-tetraphenyl-21H,23H-porphyrin copper (II), copper phthalocyanine, copper tetramethyl phthalocyanine, zinc phthalocyanine, titanium oxide phthalocyanine, magnesium phthalocyanine and the like. The buffer layer can be prepared by forming one of the buffer compounds into thin film by known methods, such as by vapor deposition or spin coating. The thickness of buffer layer thus formed is not particularly limited, and can be from, for example, about 5 nanometers to about 300 nanometers, and optionally from about 10 nanometers to about 100 nanometers.

The hole injection-assistant layer can be formed of various suitable known materials, such as aromatic tertiary amines such as those disclosed in U.S. Pat. No. 4,539,507, the disclosure of which is fully incorporated herein by reference. Suitable exemplary aromatic tertiary amines include, but are not limited to, bis(4-dimethylamino-2-methylphenyl)phenylmethane, N,N,N-tri(p-tolyl)amine, 1,1-bis(4-di-p-tolylaminophenyl)cyclohexane, 1,1-bis(4-di-p-tolylaminophenyl)-4-phenyl cyclohexane, N,N'-diphenyl-N,N'-bis(3-methylphenyl)-1,1'-biphenyl-4,4'-diamine, N,N'-diphenyl-N,N'-bis(3-methylphenyl)-1,1'-biphenyl-4,4'-diamine, N,N'-diphenyl-N,N'-bis(4-methoxyphenyl)-1,1'-biphenyl-4,4'-diamine, N,N,N',N'-tetra-p-tolyl-1,1'-biphenyl-4,4'-diamine, N,N'-bis(1,1'-biphenyl-4-yl)-N,N'-diphenyl-1,1'-biphenyl-4,4'-diamine, N,N,N',N'-tetrakis(1,1'-biphenyl-4-yl)-1,1'-biphenyl-4,4'-diamine, N,N'-di-1-naphthyl-N,N'-diphenyl-1,1'-biphenyl-4,4'-diamine, N,N,N',N'-tetra-1-naphthyl-1,1'-biphenyl-4,4'-diamine, mixtures thereof and the like; polynuclear aromatic amines, examples of which include polynuclear aromatic amines like N,N-bis-[4'-(N-phenyl-N-m-tolylamino)-4-biphenylyl]aniline, N,N-bis-[4'-(N-phenyl-N-m-tolylamino)-4-biphenylyl]-m-toluidine, N,N-bis-[4'-(N-phenyl-N-m-tolylamino)-4-biphenylyl]-p-toluidine, N,N-bis-[4'-(N-phenyl-N-p-tolylamino)-4-biphenylyl]aniline, N,N-bis-[4'-(N-phenyl-N-p-tolylamino)-4-biphenylyl]-m-toluidine, N,N-bis-[4'-(N-phenyl-N-p-tolylamino)-4-biphenylyl]-p-toluidine, N,N-bis-[4'-(N-phenyl-N-p-chlorophenylamino)-4-biphenylyl]-m-toluidine, N,N-bis-[4'-(N-phenyl-N-m-chlorophenylamino)-4-biphenylyl]-m-toluidine, N,N-bis-[4'-(N-phenyl-N-m-chlorophenylamino)-4-biphenylyl]-p-toluidine, N,N-bis-[4'-(N-phenyl-N-m-tolylamino)-4-biphenylyl]-p-chloroaniline, N,N-bis-[4'-(N-phenyl-N-p-tolylamino)-4-biphenylyl]-m-chloroaniline, N,N-bis-[4'-(N-phenyl-N-m-tolylamino)-4-biphenylyl]-1-aminonaphthalene, mixtures thereof and the like.

Any suitable appropriate material may be selected for the hole transporting layer. Examples of hole-transporting materials that can be utilized in the hole transport layer include polypyrrole, polyanliune, poly(phenylene vinylene), polythiophene, polyarylamine, PEDOT, and their derivatives, and known semiconductive organic materials; porphyrin derivatives such as 1,10,15,20-tetraphenyl-21H,23H-porphyrin copper (II); copper phthalocyanine, copper tetramethyl phthalocyanine; zinc phthalocyanine; titanium oxide phthalocyanine; magnesium phthalocyanine; and the like.

An additional class of hole transporting materials that can be utilized in the hole transport layer are the aromatic tertiary amines. Suitable exemplary aromatic tertiary amines include, but are not limited to, bis(4-dimethylamino-2-methylphenyl)phenylmethane, N,N,N-tri(p-tolyl)amine, 1,1-bis(4-di-p-tolylaminophenyl)cyclohexane, 1,1-bis(4-di-p-tolylaminophenyl)-4-phenyl cyclohexane, N,N'-diphenyl-N,N'-bis(3-methylphenyl)-1,1'-biphenyl-4,4'-diamine, N,N'-diphenyl-N,N'-bis(3-methylphenyl)-1,1'-biphenyl-4,4'-diamine, N,N'-diphenyl-N,N'-bis(4-methoxyphenyl)-1,1'-biphenyl-4,4'-diamine, N,N,N',N'-tetra-p-tolyl-1,1'-biphenyl-4,4'-diamine, N,N'-di-1-naphthyl-N,N'-diphenyl-1,1'-biphenyl-4,4'-diamine, mixtures thereof and the like. Another class of aromatic tertiary amines are polynuclear aromatic amines. Examples of these polynuclear aromatic amines include, but are not limited to, N,N-bis[4'-(N-phenyl-N-m-tolylamino)-4-biphenylyl]aniline; N,N-bis-[4'-(N-phenyl-N-m-tolylamino)-4-biphenylyl]-m-toluidine; N,N-bis-[4'-(N-phenyl-N-m-tolylamino)-4-biphenylyl]-p-toluidine; N,N-bis-[4'-(N-phenyl-N-p-tolylamino)-4-biphenylyl]aniline; N,N-bis-[4'-(N-phenyl-N-p-tolylamino)-4-biphenylyl]-m-toluidine; N,N-bis-[4'-(N-phenyl-N-p-tolylamino)-4-biphenylyl]-p-toluidine; N,N-bis-[4'-(N-phenyl-N-p-chlorophenylamino)-4-biphenylyl]-m-toluidine; N,N-bis-[4'-(N-phenyl-N-m-chlorophenylamino)-4-biphenylyl]-m-toluidine; N,N-bis-[4'-(N-phenyl-N-m-chlorophenylamino)-4-biphenylyl]-p-toluidine; N,N-bis-[4'-(N-phenyl-N-m-tolylamino)-4-biphenylyl]-p-chloroaniline; N,N-bis-[4'-(N-phenyl-N-p-tolylamino)-4-biphenylyl]-m-chloroaniline; N,N-bis-[4'-(N-phenyl-N-m-tolylamino)-4-biphenylyl]-1-aminonaphthalene, mixtures thereof and the like; 4,4'-bis(9- carbazolyl)-1,1'-biphenyl compounds, such as, for example 4,4'-bis(9-carbazolyl)-1,1'-biphenyl and 4,4'-bis(3-methyl-9-carbazolyl)-1,1'-biphenyl, and the like.

Any suitable appropriate electron component may be selected for the electron transporting layer. For blue emitting devices, it is desirable that the electron transport materials have a band gap in the blue region of, for example, from about 400 nanometers to about 550 nanometers. This layer can be formed by known methods, such as by vacuum deposition, and wherein the layer thickness can be from about 1 nanometer to about 300 nanometers, and preferably from about 5 nanometers to about 100 nanometers. Illustrative examples of the electron transporting compounds include quinolines, such as those disclosed in Japanese patent application 1995-150137, triazine compounds such as those disclosed in U.S. Pat. No. 6,225,467, and metal chelates of 8-hydroxyquinoline as disclosed in U.S. Pat. Nos. 4,539,507; 5,151,629, and 5,150,006, the disclosures of each of which are totally incorporated herein by reference.

The electron injection assistant layer is optional, but can be useful in blue emitting devices. A primary purpose of this layer is to build up a stepwise energy level to assist electron injection from the cathode into the electron transport layer, thus reducing the driving voltage of the device. A number of suitable electron transport known in the art may be used for this layer. Illustrative examples of electron transport materials, which may be selected for the electron injection-assistant layer, include triazine compounds such as those disclosed in U.S. Pat. No. 6,225,467, the disclosure of which is totally incorporated herein by reference, and metal chelates of 8-hydroxyquinoline such as tris(8-hydroxyquinolinate) aluminum, a preferred one, tris(8-hydroxyquinolinate) gallium, bis(8-hydroxyquinolinate) magnesium, bis(8-hydroxyquinolinate) zinc, tris(5-methyl-8-hydroxyquinolinate)aluminum, tris(7-propyl-8-quinolinolato)aluminum, bis[benzo{f}-8-quinolinate]zinc, bis(10-hydroxybenzo[h]quinolinate)beryllium, and the like. Another class of preferred electron injecting compounds are the metal thioxinoid compounds, illustrated in U.S. Pat. No. 5,846,666, the disclosure of which is totally incorporated herein by reference. Illustrative examples of metal thioxinoid compounds include bis(8-quinolinethiolato)zinc, bis(8-quinolinethiolato)cadmium, tris(8-quinolinethiolato)gallium, tris(8-quinolinethiolato)indium, bis(5-methylquinolinethiolato)zinc, tris(5-methylquinolinethiolato)gallium, tris(5-methylquinolinethiolato)indium, bis(5-methylquinolinethiolato)cadmium, bis(3-methylquinolinethiolato)cadmium, bis(5-methylquinolinethiolato)zinc, bis[benzo{f}-8-quinolinethiolato]zinc, bis[3-methylbenzo{f}-8-quinolinethiolato]zinc, bis[3,7-dimethylbenzo{f}-8-quinolinethiolato]zinc, and the like. Preferred are bis(8-quinolinethiolato)zinc, bis(8-quinolinethiolato)cadmium, tris(8-quinolinethiolato)gallium, tris(8-quinolinethiolato)indium and bis[benzo{f}-8-quinolinethiolato]zinc.

The electrode, such as cathode, can be constructed of any suitable appropriate metal, including high, for example from about 4 eV to about 6 eV, or a low work function component, such as metals with, for example, an eV of from about 2.5 eV to about 4.0 eV (electron volts). The cathode can be derived from a combination of a low work function metal (less than or equal to about 4 eV) and at least one other metal. Effective proportions of the low work function metal to the second or other metal are from, for example, about 0.1 percent to about 99.9 percent by weight. Illustrative examples of low work function metals include alkaline metals, such as lithium or sodium, Group 2A or alkaline earth metals, such as beryllium, magnesium, calcium, or barium, and Group III metals including rare earth metals and the actinide group metals, such as scandium, yttrium, lanthanum, cerium, europium, terbium, or actinium. Lithium, magnesium and calcium are in embodiments the preferred low work function metals.

The thickness of cathode is from, for example, about 10 nanometers to about 500 nanometers. The Mg:Ag cathodes of U.S. Pat. No. 4,885,211 constitute one preferred cathode construction. Another preferred cathode construction is described in U.S. Pat. No. 5,429,884, wherein the cathodes are formed from lithium alloys with other high work function metals such as aluminum and indium.

Both the anode and the cathode can be of any convenient appropriate forms, such as for example, wherein a thin conductive layer can be coated onto a light transmissive substrate, for example, a transparent or substantially transparent glass plate or plastic film. The EL device can include a light transmissive anode formed from tin oxide or indium tin oxide coated on a glass plate. Also, very thin, for example less than about 200 angstroms, like 95 to about 100 light-transparent metallic anodes can be used, such as gold, palladium, and the like. In addition, transparent or semitransparent thin layers of conductive carbon or conjugated polymers, such as polyaniline, polypyrrole, and the like, can be used as anodes. Any light transmissive polymeric film can be employed as the substrate.

EXEMPLARY EMBODIMENTS

According to an exemplary embodiment of the present invention, a novel carbozole compound according to the present invention may be N-phenyl-3,6-binaphthylcarbazole (PBNC) that may be prepared by the following synthesis:

PBNC

Figure 1:
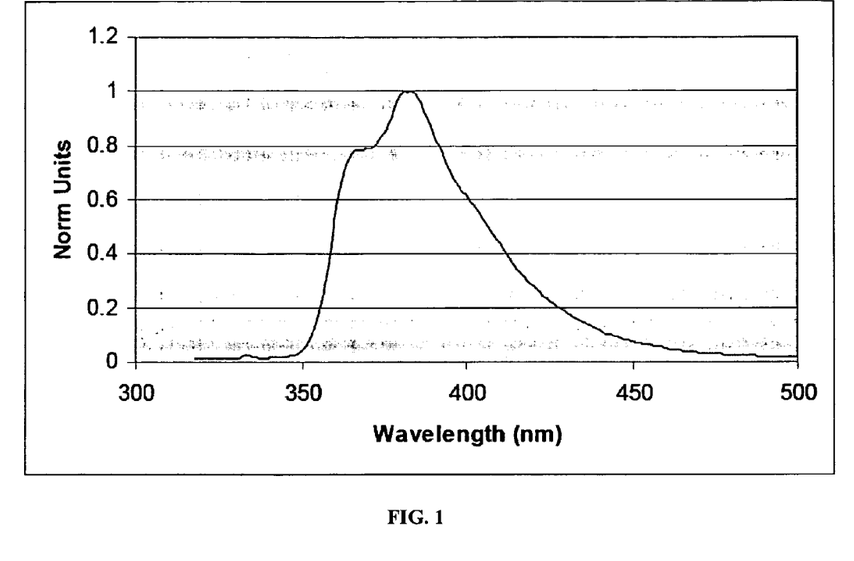
FIG. 1 shows the in solution emission fluorescence of an exemplary carbazole compound according to an embodiment of the present invention.

The resulting exemplary compound PBNC was found to have very good properties. For example, this compound was found to have a high melting point of 437° C. Additionally, as shown in FIG. 1, this compound was also found to produce a strong fluorescence in the blue region when tested in solution.

The exemplary compound, PBNC, described above may be used in various exemplary EL devices.

First Exemplary Embodiment

Figure 2:
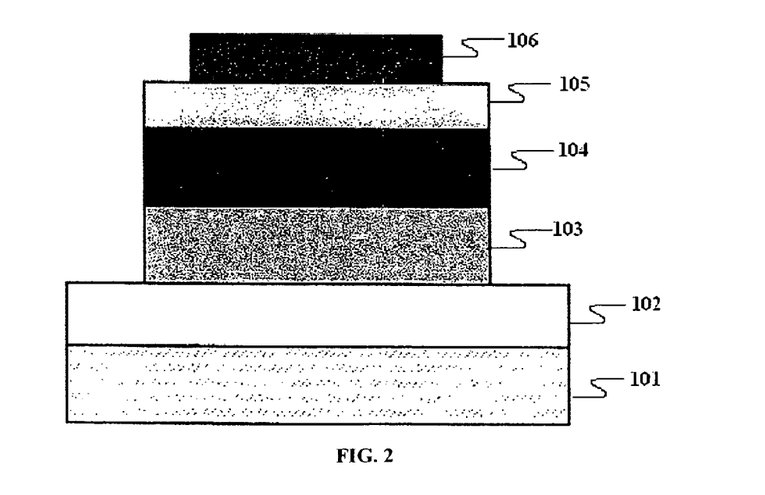
FIG. 2 is an exemplary EL device according to a first exemplary embodiment of the present invention.

FIG. 2 shows a first exemplary EL device that uses the exemplary novel carbazole compound described above as the light emitting layer.

According to this exemplary embodiment the EL device may comprise a glass substrate 101, an ITO/CuPc (copper (II) phthalocyanine) anode/hole injection layer 102 approximately 15 nm thick, a hole transporting layer 103 such as NPB (N,N'-diphenyl-N,N'-bis(1-naphthyl)-1,1'-biphenyl-4,4/-diamine) approximately 30 nm thick, a light emitting layer 104 comprising only the PBNC compound formulated above approximately 30 nm thick, an electron transporting layer 105 such as a triazine compound of approximately 25 nm thick, and a cathode layer 106, such as Mg and/or Al.

Figure 3:
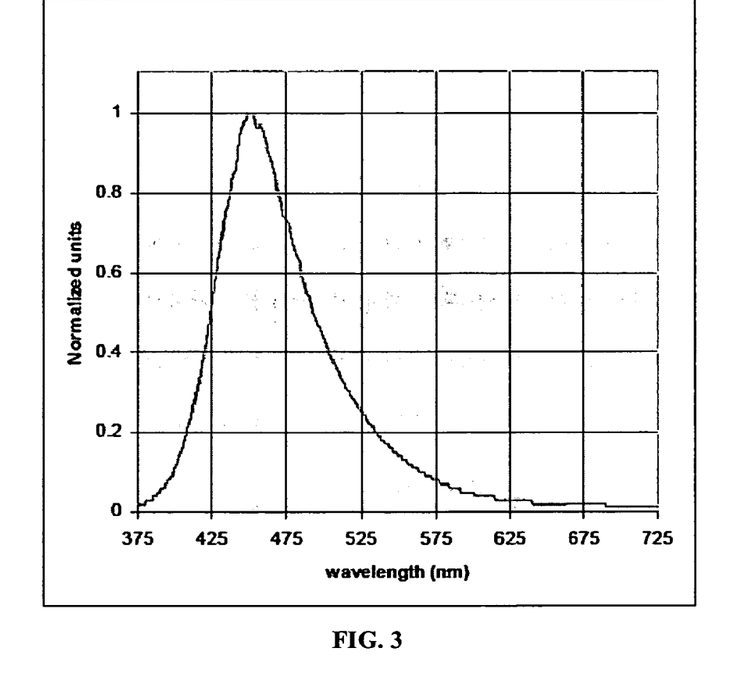
FIG. 3 shows the electroluminescence spectra of the first exemplary embodiment of the present invention.

FIG. 3 shows the electroluminescent spectra of this first exemplary EL device using only the PBNC compound in the luminescent layer. As the data indicates, PBNC is a blue emitting material with the emission maxima at approximately 450 nm, i.e. the blue region.

Second Exemplary Embodiment

Figure 4:
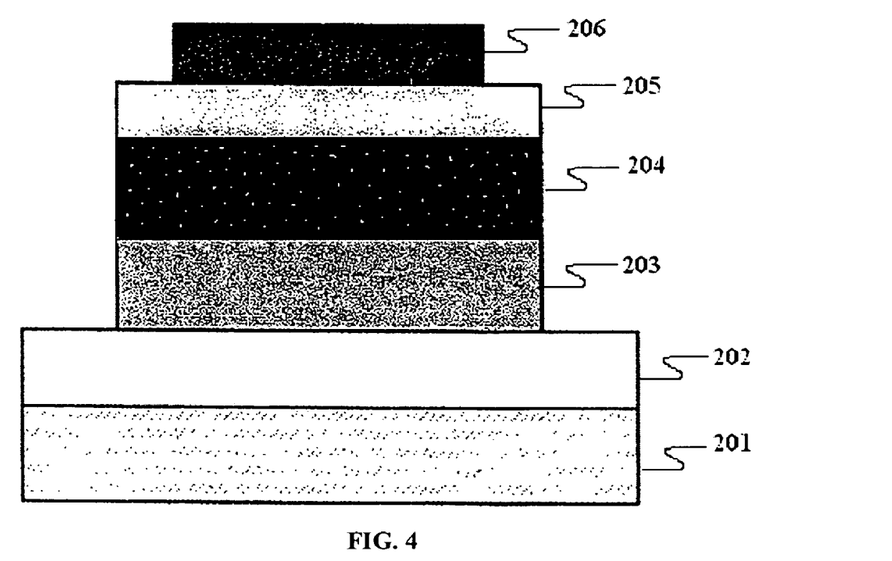
FIG. 4 is an exemplary EL device according to a second exemplary embodiment of the present invention.

FIG. 4 shows a second exemplary EL device that uses the exemplary novel carbazole compound described above as the host material for a light emitting layer.

Like in the first exemplary embodiment, in this second exemplary embodiment the EL device may comprise an ITO glass substrate 201, a CuPc anode layer 202 approximately 15 nm thick, a hole transporting layer 203 such as NPB approximately 30 nm thick, an electron transporting layer 205, such as a triazine compound of approximately 25 nm thick, and a cathode layer 206, such as Mg and/or Al.

However, in this second exemplary compound, the luminescent layer 204 comprising the PBNC compound formulated above also comprises a substituted dinapthyl anthracene based blue emitting material (BH2). Accordingly, instead of being 100% PBNC, the light emitting layer in this second exemplary embodiment is a 50:50 mixture of PBNC and BH2. The thickness of layer 204 may be approximately 30 nm.

Figure 5:
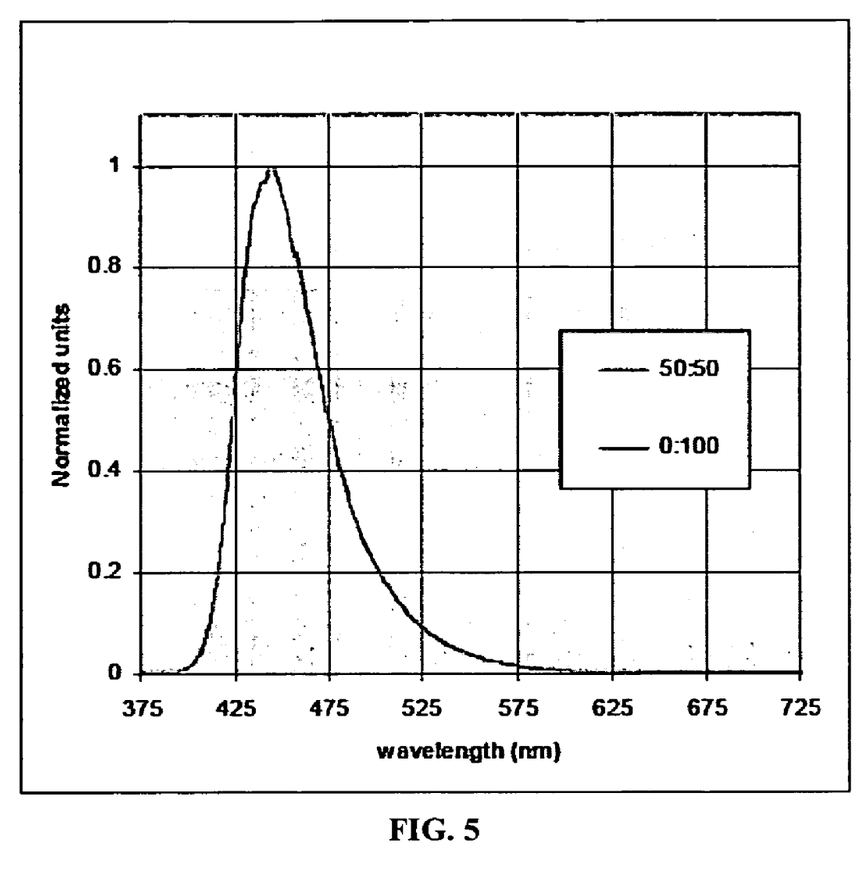
FIG. 5 shows the electroluminescence spectra of the second exemplary embodiment of the present invention.

The electroluminescence spectra for the second exemplary embodiment was measured and compared to a device containing 100% BH2 as the light emitting layer. As shown in FIG. 5, the two spectra are coincidental. This means that there is complete recombination of the charge on the BH2 material (guest material) and the emission observed is entirely from BH2. This indicates that the compounds according to the present invention, in this exemplary embodiment PBNC, are very good host materials for anthracene based blue emitting materials.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

We claim:

1. An organic electroluminescent device comprising:
an anode,
a cathode, and
a compound of Formula I:

Formula I wherein $R^2$ may be a substituent selected from the group consisting of hydrogen, alkyl, substituted or unsubstituted aryl, heteroaryl, and alicyclic alkyl; wherein at least one of the $R^1$ substituents is different from $R^2$ and is diphenylvinyl; and wherein if only one of the $R^1$ substituents is diphenylvinyl then the other $R^1$ substituent is selected from the group consisting of hydrogen, an alicyclic alkyl group with, for example, from about 3 to about 15 carbon atoms, a dialkylamino group with from about 2 to about 25 carbon atoms, cyclohexyl, dimethylamino, diethylamino, a cyano group and halogens.

2. The organic electroluminescent device of claim 1, wherein the two R1 substituents are the same.

3. The organic electroluminescent device of claim 1, wherein the two R1 substituents are different.

4. The organic electroluminescent device of claim 1, further comprising a glass substrate.

5. The organic electroluminescent device of claim 1, further comprising a buffer layer.

6. The organic electroluminescent device of claim 1, further comprising a hole transporting layer.

7. The organic electroluminescent device of claim 1, further comprising an electron transporting layer.

8. The organic electroluminescent device of claim 1, wherein the compound of Formula I is used as a light emitting material.

9. The organic electroluminescent device of claim 8, wherein the light emitting material is composed only of the compound of Formula I.

10. The organic electroluminescent device of claim 8, wherein the light emitting material is composed of a mixture comprising the compound of Formula I.

11. The organic electroluminescent device of claim 8, wherein the light emitting material is composed of a mixture comprising the compound of Formula I and of a substituted dinaphthyl anthracene based blue emitting material (BH2).

12. An organic electroluminescent device comprising:
an anode;
a cathode, and
N-phenyl-3,6-binaphthylcarbazole (PBNC).

13. The organic electroluminescent device of claim 12, wherein the anode comprises indium tin oxide and copper (II) phthalocyanine (CuPc); and
the cathode comprises Mg or Al.

14. The organic electroluminescent device of claim 13, further comprising:
an electron transporting layer consisting of a triazene compound; and
a hole transporting layer consisting of N,N'-diphenyl-N, N'-bis(1-naphthyl)-1,1'-biphenyl-4,4/-diamine (NPB).

15. The organic electroluminescent device of claim 14, wherein the light emitting layer consists only of N-phenyl-3, 6-binaphthylcarbazole (PBNC).

16. The organic electroluminescent device of claim 14, wherein the light emitting layer consists of a 50:50 mixture of N-phenyl-3,6-binaphthylcarbazole (PBNC) and a substituted dinaphthyl anthracene based blue emitting material (BH2).

* * * * *